(12) United States Patent
Lee et al.

(10) Patent No.: US 12,530,992 B2
(45) Date of Patent: Jan. 20, 2026

(54) DISPLAY DEVICE WITH IMPROVED IMPACT RESISTANCE AND MANUFACTURING METHOD OF A SUPPORT FILM

(71) Applicant: Samsung Display Co., LTD., Yongin-si (KR)

(72) Inventors: Jung Hun Lee, Yongin-si (KR); Sung Sang Ahn, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 159 days.

(21) Appl. No.: 18/314,197

(22) Filed: May 9, 2023

(65) Prior Publication Data

US 2024/0078934 A1 Mar. 7, 2024

(30) Foreign Application Priority Data

Sep. 7, 2022 (KR) .................. 10-2022-0113132

(51) Int. Cl.
*G09F 9/30* (2006.01)
*G09F 9/302* (2006.01)

(52) U.S. Cl.
CPC .............. *G09F 9/301* (2013.01); *G09F 9/302* (2013.01)

(58) Field of Classification Search
CPC ..... G06F 1/1624; G06F 1/1656; G06F 1/1652
See application file for complete search history.

(56) References Cited

U.S. PATENT DOCUMENTS

| 2013/0075768 A1* | 3/2013 | Kim ..................... H10K 71/233 438/34 |
| 2017/0229665 A1* | 8/2017 | Park ..................... H10K 50/844 |
| 2018/0103552 A1* | 4/2018 | Seo ...................... H05K 5/0017 |
| 2018/0134007 A1* | 5/2018 | Lee ......................... B32B 25/20 |
| 2021/0323269 A1 | 10/2021 | Lee |

FOREIGN PATENT DOCUMENTS

| KR | 10-2015-0073348 | 7/2015 |
| KR | 10-2019-0060904 | 6/2019 |
| KR | 10-2021-0150942 | 12/2021 |

OTHER PUBLICATIONS

Shuying Wu et al "Aligning multilayer graphene flakes with an external electric field to improve multifunctional properties of epoxy nanocomposites", Nov. 2015, Carbon, vol. 94, pp. 607-618, (Year: 2015).*

* cited by examiner

*Primary Examiner* — James Wu
*Assistant Examiner* — Dakota M Talbert

(57) ABSTRACT

A display device and a method of manufacturing a support film are provided. The display device includes a display panel that slides in a first direction, a panel support that supports a bottom surface of the display panel, and a support film disposed between the display panel and the panel support, wherein the support film includes a base portion and buffer members each in a rod shape dispersed in the base portion.

19 Claims, 12 Drawing Sheets

DISPLAY DEVICE WITH IMPROVED IMPACT RESISTANCE AND MANUFACTURING METHOD OF A SUPPORT FILM

CROSS REFERENCE TO RELATED APPLICATION(S)

This application claims priority to and benefits of Korean Patent Application No. 10-2022-0113132 under 35 U.S.C. § 119, filed on Sep. 7, 2022, in the Korean Intellectual Property Office (KIPO), the entire contents of which are incorporated herein by reference.

BACKGROUND

1. Technical Field

The disclosure relates to a display device including a support film and manufacturing method of the support film.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a light emitting material and an inorganic light emitting diode using an inorganic material as a light emitting material.

Recently, under development of display technology, research and development on a display device having a flexible display is being actively conducted. The flexible display may extend or reduce a display screen by folding, bending, or sliding the display screen, thereby contributing greatly to reduction of a volume of the display device or design change thereof.

SUMMARY

Aspects of the disclosure provide a display device with improved impact resistance.

Aspects of the disclosure also provide a method of manufacturing a support film with improved impact resistance.

However, aspects of the disclosure are not restricted to the one set forth herein. The above and other aspects of the disclosure will become more apparent to one of ordinary skill in the art to which the disclosure pertains by referencing the detailed description of the disclosure given below.

In an embodiment, a display device includes a display panel that slides in a first direction; a panel support that supports a bottom surface of the display panel; and a support film disposed between the display panel and the panel support; wherein the support film comprises a base portion and buffer members each in a rod shape dispersed in the base portion.

The display panel may include a first area, and a second area disposed in a side of the first area in the first direction and sliding in the first direction, the panel support may include a support plate supporting the bottom surface of the first area of the display panel, and segments supporting the bottom surface of the second area of the display panel, and the support film may overlap the first area of the display panel and the second area of the display panel in a plan view.

Each of the segments may extend in a second direction intersecting the first direction and may be spaced apart from each other in the first direction, and each of the buffer members may extend in a third direction perpendicular to the first direction and the second direction.

A width of each of the buffer members in the third direction may be smaller than a width of the support film in the third direction.

The buffer members may be disposed to be spaced apart from sides of the support film in the third direction.

The buffer members may be arranged to be spaced apart from each other in the first direction.

The buffer members may be arranged to be spaced apart from each other in the second direction.

Each of the buffer members may include metal, and the base portion may include resin.

The display panel may further include a third area disposed on another side of the first area in the first direction and sliding in the first direction, and a subsidiary area disposed on a side of the first area in a second direction intersecting the first direction.

In an embodiment, a display device includes a display panel including: a flat area and a bendable area disposed adjacent to the flat area; a panel support that supports a bottom surface of the display panel; and a support film disposed between the display panel and the panel support, wherein the support film includes a base portion and buffer members dispersed in the base portion, and the buffer members extend in a thickness direction.

The panel support may include a support plate overlapping the flat area in a plan view, and segments overlapping the bendable area in a plan view, and the bendable area may slide in a first direction parallel to the flat area.

Each of the segments may extend in a second direction parallel to the flat area and intersecting the first direction, and the segments may be spaced apart from each other in the first direction.

A thickness of the buffer member may be smaller than a thickness of the support film.

The buffer members may be arranged to be spaced apart from each other in the first direction.

The buffer members may be arranged to be spaced apart in the first direction.

Each of the buffer members may include metal, and the base portion may include resin.

In an embodiment, a method of manufacturing a support film, the support film supporting a bottom surface of a display panel that slides in a first direction, includes applying a base resin; dispersing buffer members in the base resin; forming electric field in the base resin to align the buffer members; and curing the base resin on which the buffer members are aligned.

Each of the buffer members may include a metal.

In a step of aligning the buffer members, the buffer members may be aligned to be spaced apart from each other in the first direction.

In the step of aligning the buffer members, each of the buffer members may extend in a thickness direction of the base resin.

The display device according to an embodiment may have improved impact resistance.

The method of manufacturing a support film according to an embodiment may provide a support film with improved impact resistance.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first", "second", etc. may be used herein to describe various elements, these elements should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the invention will be described with reference to the attached drawings.

Figure 1:
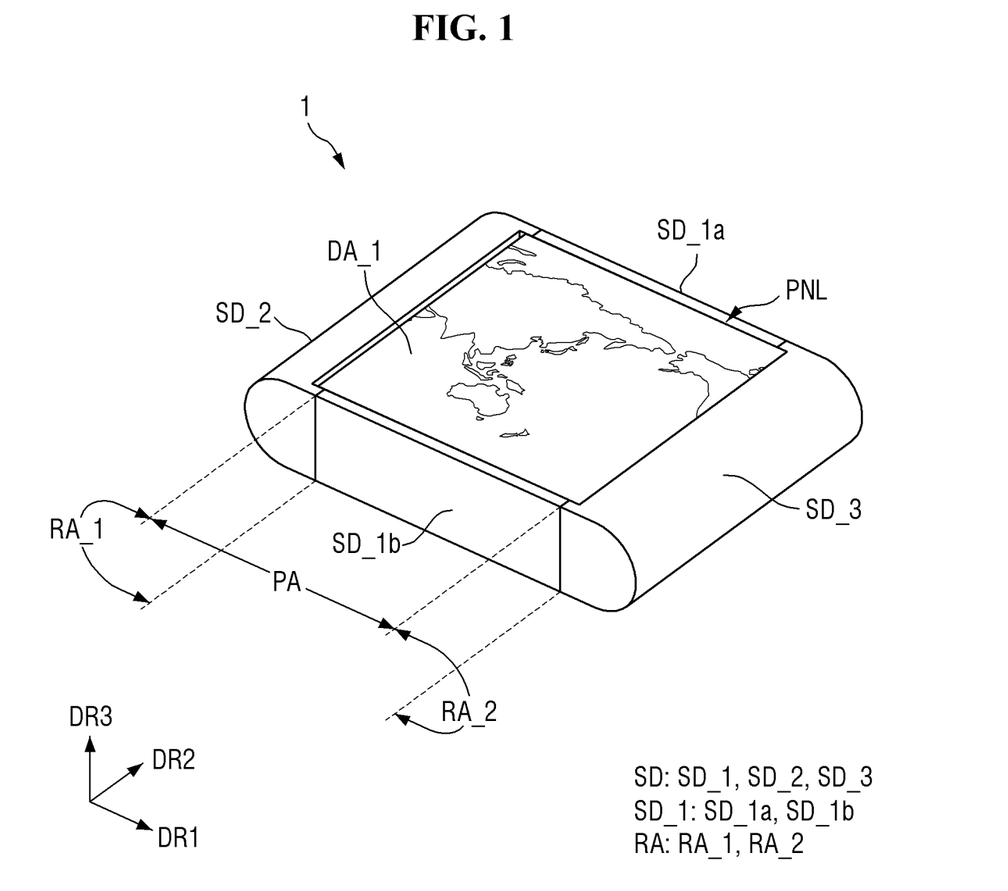
FIG. 1 is a schematic perspective view of a display device according to an embodiment.
Figure 2:
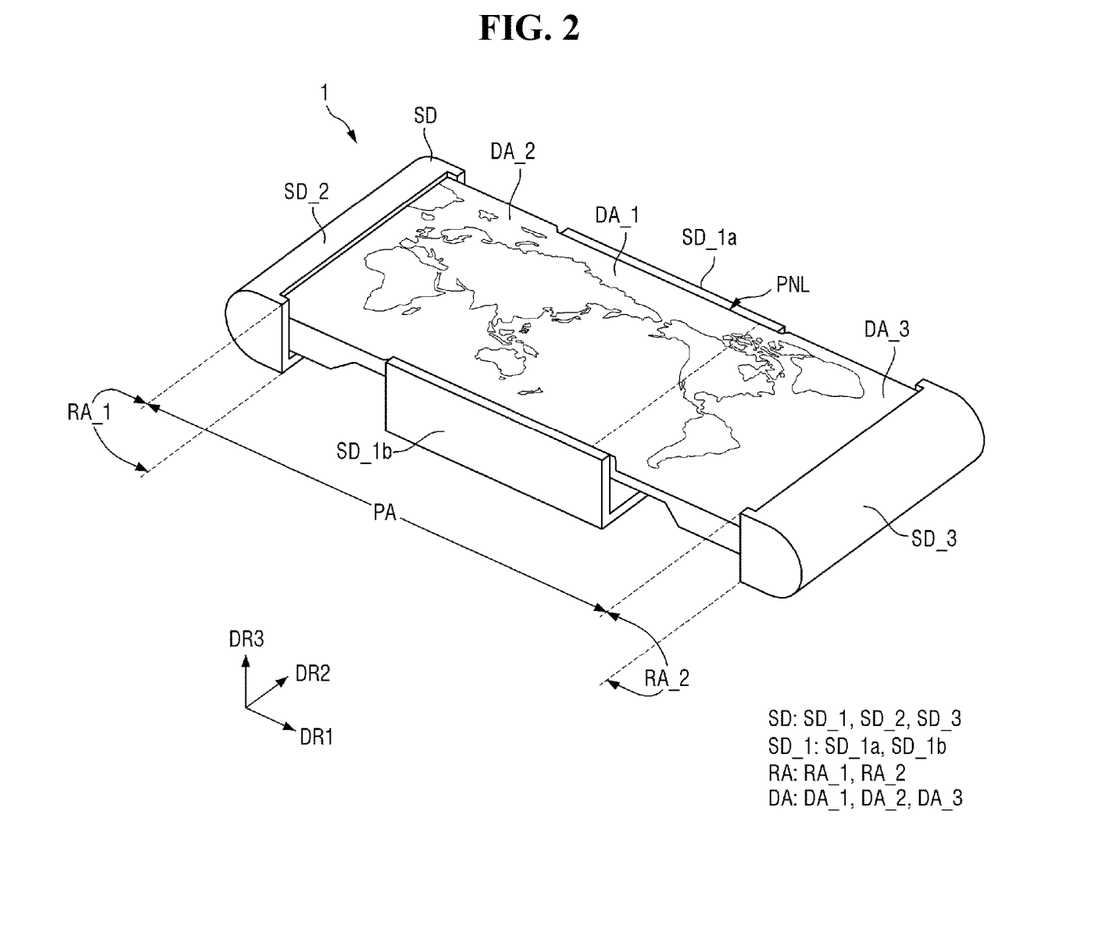
FIG. 2 is a schematic perspective view illustrating a form in which the display device according to an embodiment is expanded.

FIG. 1 is a schematic perspective view of a display device according to an embodiment. FIG. 2 is a schematic perspective view illustrating a form in which the display device according to an embodiment is expanded.

Referring to FIGS. 1 and 2, the display device 1 according to an embodiment may be a sliding display device or a slidable display device capable of sliding. The display device 1 according to an embodiment may be a multi-slidable display device slid in directions (e.g., both directions), but is not limited thereto. For example, the display device 1 may be a single slidable display device slid in only one direction. Hereinafter, it will be mainly described that the display device 1 according to an embodiment may be a multi-slidable display device.

The display device 1 may have a three-dimensional (3D) shape. For example, the display device 1 may have a rectangular shape or a 3D shape similar to a rectangular shape. A direction parallel to a first side of the display device 1 may be referred to as a first direction DR1, a second side of the display device 1 may be referred to as a second direction DR2, and a thickness direction of the display device 1 may be referred to as a third direction DR3. Unless otherwise specified, a particular direction may refer to both sides in the particular direction. If there is the need to distinguish one side from the other side in the particular direction, one side in the particular direction may be referred to as a first side, and the other side in the particular direction may be referred to as a second side. Referring to FIG. 1, a direction indicated by an arrow may be referred to as a first side, and the opposite direction thereof may be referred to as a second side. The first and second directions DR1 and DR2 may be perpendicular to each other, the first and third directions DR1 and DR3 may be perpendicular to each other, and the second and third directions DR2 and DR3 may be perpendicular to each other.

The display device 1 may include a flat area PA and bendable areas RA. The flat area PA of the display device 1 may overlap an area that exposes a display panel PNL of a panel container SD. The bendable areas RA of the display device 1 may be formed on the inside of the panel container SD. The bendable areas RA may be bent with a curvature radius (e.g., a predetermined or selectable curvature radius) and may be areas where the display panel PNL is bent in accordance with the predetermined curvature radius. The bendable areas RA may be disposed on sides (e.g., both sides), in the first direction DR1, of the flat area PA. For example, a first bendable area RA_1 may be disposed on a second side, in the first direction DR1, of the flat area PA, and a second bendable area RA_2 may be disposed on a first side, in the first direction DR1, of the flat area PA. The first bendable area RA_1 may be an area where a second area PNL_2 of the display panel PNL is bent, and the second bendable area RA_2 may be an area where a third area PNL_3 of the display panel PNL is bent. As the display device 1 is expanded, the area of the flat area PA may increase. Accordingly, a distance between the first and second bendable areas RA_1 and RA_2 may increase.

Figure 3:
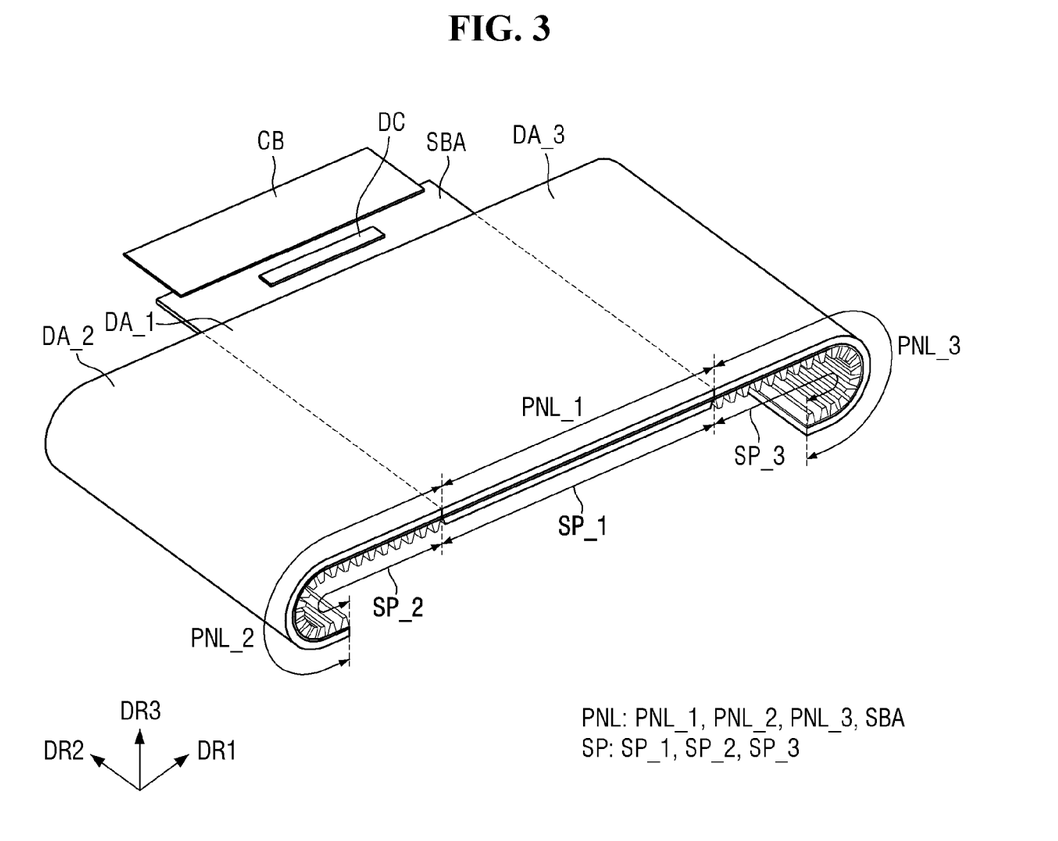
FIG. 3 is a schematic perspective view illustrating a structure of a display panel according to an embodiment.
Figure 4:
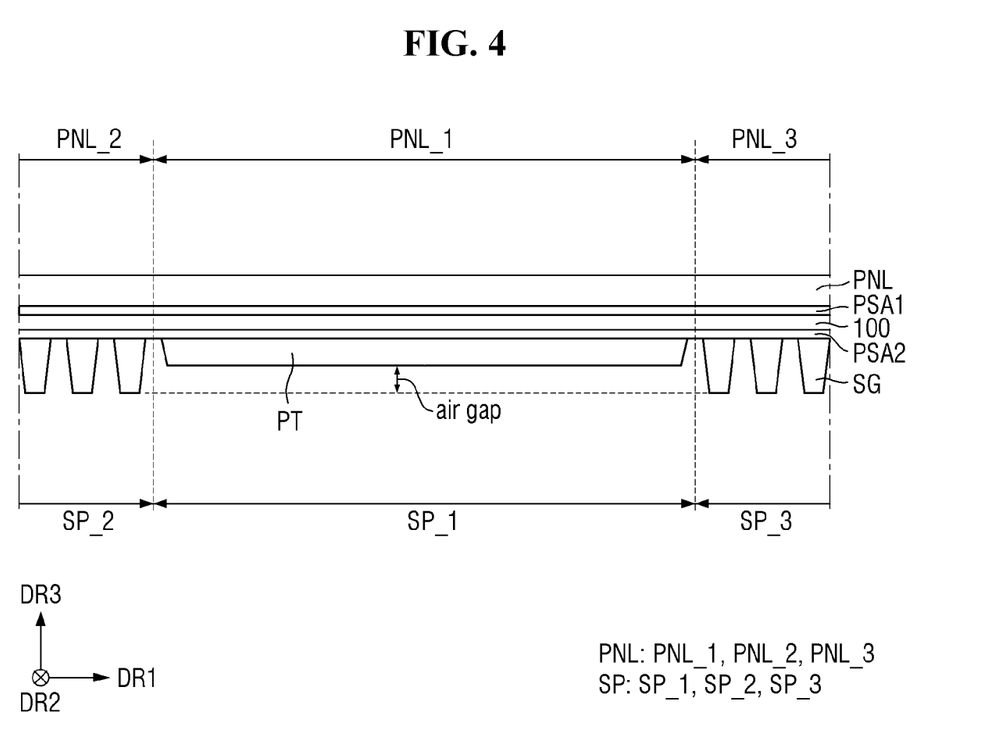
FIG. 4 is a schematic side view illustrating a stacked structure of a display device according to an embodiment.

FIG. 3 is a schematic perspective view illustrating a structure of a display panel according to an embodiment. FIG. 4 is a schematic side view illustrating a stacked structure of a display device according to an embodiment.

Referring to FIGS. 3 and 4 in conjunction with FIGS. 1 and 2, the display device 1 according to an embodiment may include the display panel PNL, a first adhesive layer PSA1, a support film, a second adhesive layer PSA2, the panel support SP and the panel container SD.

Any type of display panel such as an organic light-emitting display panel including an organic light-emitting layer, a micro-light-emitting diode (microLED) display panel using microLEDs, a quantum-dot light-emitting diode display panel using a quantum-dot light-emitting layer, an inorganic light-emitting display panel using inorganic light-emitting element, or the like may be applicable to the display panel PNL, which may be a panel for displaying an image. Referring to FIG. 3, a first surface, in the third direction DR3, of the display panel PNL may be the top surface of the display panel PNL, and a second surface, in the third direction DR3, of the display panel PNL may be the bottom surface of the display panel PNL where the panel support SP is disposed.

The display panel PNL may be a flexible panel. The display panel PNL may be flexible enough to be rollable, bendable, or foldable in part in the panel container SD. The display panel PNL may be slidable in the first direction DR1.

The display panel PNL may include a first area PNL_1, which may be supported by a first support member SP_1 of the panel support SP, the second area PNL_2, which may be supported by a second support member SP_2 of the panel support SP, and the third area PNL_3, which may be supported by a third support member SP_3 of the panel support SP. The first area PNL_1 of the display panel PNL may be always flat regardless of the sliding of the display panel PNL. The second and third areas PNL_2 and PNL_3 of the display panel PNL may be areas that are already rolled, bent, or folded or rollable, bendable, or foldable in accordance with the sliding of the display panel PNL.

The display area of the display panel PNL may be classified into first, second, and third display areas DA_1, DA_2, and DA_3 depending on whether and the degree to which the display panel PNL is slid open. The second and third display areas DA_2 and DA_3 may appear depending on whether and the degree to which the display panel PNL is slid open. For example, in a first state of not being slid open, the display panel PNL may include the first display area DA_1 having a first area. In a second state of being slid open, the display panel PNL may further include the second and third display areas DA_2 and DA_3, which may be extensions from the first display area DA_1.

A second display area DA_2 may be an area where the second area PNL_2 of the display panel PNL and the flat area PA overlap with each other, and a third display area DA_3 may be an area where the third area PNL_3 of the display panel PNL and the flat area PA overlap with each other. The areas of the second and third display areas DA_2 and DA_3 may vary depending on the degree to which the display panel PNL is slid open. In case that the display device 1 is slid open completely, the second and third display areas DA_2 and DA_3 may have second and third areas, correspondingly, and the display area may have a fourth area, which may be the sum of the first, second, and third areas. Here, the fourth area may be a maximum area of the display area.

The first display area DA_1 may overlap the first area PNL_1 of the display panel PNL. The second display area DA_2 may overlap at least part of the second area PNL_2 of the display panel PNL. The third display area DA_3 may overlap at least part of the third area PNL_3 of the display panel PNL. The boundary between the first and second display areas DA_1 and DA_2 may overlap the boundary between the first and second areas PNL_1 and PNL_2, and the boundary between the first and third display areas DA_1 and DA_3 may overlap the boundary between the first and third areas PNL_1 and PNL_3. However, the disclosure is not limited to this.

The display panel PNL may further include a subarea SBA. The subarea SBA may be disposed on a side, in the second direction DR2, of the first area PNL_1 of the display panel PNL. The subarea SBA may be an area that is foldable or bendable. In an embodiment where the subarea SBA is bent, the subarea SBA may overlap the first area PNL_1 in the third direction DR3. The subarea SBA may have a rectangular shape in a plan view, but the disclosure is not limited thereto.

The length, in the first direction DR1, of the subarea SBA may be substantially a same as the length, in the first direction DR1, of the first area PNL_1. As another example, the length, in the first direction DR1, of the subarea SBA may be less (or smaller) than the length, in the first direction DR1, of the first area PNL_1. The length, in the second direction DR2, of the subarea SBA may be less (or smaller) than the length, in the second direction DR2, of the first area PNL_1, but the disclosure is not limited thereto.

A driving circuit DC and a circuit board CB may be disposed on a surface, in the third direction DR3, of the subarea SBA. The circuit board CB may be attached on the subarea SBA via an anisotropic conductive film (ACF). The circuit board CB may be electrically connected to a pad part formed on the subarea SBA. The circuit board CB may be a flexible film such as a printed circuit board (PCB), a flexible PCB (FPCB), a chip-on-film (COF), or the like. The driving circuit DC may be formed as an integrated circuit (IC) and may be attached on the subarea SBA in a chip-on-glass (COG) manner, or a chip-on-plastic (COP) manner, or an ultrasonic manner. As another example, the driving circuit DC may be attached on the circuit board CB.

A support film 100 may prevent the first support member SP_1, the second support member SP_2, and the third support member SP_3 of the panel support SP to be described below from becoming visible over the display panel PNL may absorb stress that may be generated in accordance with the behaviors of the first, second, and third support members SP_1, SP_2, and SP_3, thereby preventing the influence of the stress on the display panel PNL. The support film 100 may be attached on the bottom surface of the display panel PNL via the first adhesive layer PSA1, which may be disposed between the display panel PNL and the support film 100. The first adhesive layer PSA1 may be a pressure sensitive adhesive (PSA), but the disclosure is not limited thereto. Referring to FIG. 4, a first surface, in the third direction DR3, of the support film 100 may be a top surface of the support film 100 where the first adhesive layer PSA1 is disposed, and a second surface, in the third direction DR3, of the support film 100 may be a bottom surface of the support film 100 where the second adhesive layer PSA2 is disposed.

In case that an external impact is applied to the display device 1 according to an embodiment, if the impact resistance of the support film 100 is weak, there may be a risk of destroying the support film 100. Accordingly, a separate buffer member may be dispersed inside the support film in order to improve the impact resistance of the support film 100 itself. For example, the support film 100 may include a base portion 110 made of resin (see FIG. 5) and a buffer member 130 made of a metal (see FIG. 5). This will be described below in detail.

The second adhesive layer PSA2 may bond the support film 100 and the panel support SP together. The second adhesive layer PSA2 may be attached on the bottom surface of the support film 100. The second adhesive layer PSA2 may be a PSA, but the disclosure is not limited thereto.

The panel support SP may support the bottom surface of the display panel PNL and may assist with the sliding of the display panel PNL. The panel support SP may be attached on the bottom surface of the support film 100 via the second adhesive layer PSA2, which may be disposed between the support film 100 and the panel support SP. Referring to FIG. 4, the panel support SP may include the first, second, and third support members SP_1, SP_2, and SP_3, which may be disposed on the bottom surface of the display panel PNL. The panel support SP may include a metal for securing mechanical strength for supporting the display panel PNL. The panel support SP may include a metal such as SUS304 or the like, but the disclosure is not limited thereto.

The first support member SP_1 may support the first area PNL_1 of the display panel PNL. The first support member SP_1 may be disposed on the bottom surface of the first area PNL_1 of the display panel PNL. The first support member SP_1 may have substantially a same shape as the first area PNL_1 in a plan view. For example, the first support member SP_1 may be a plate having a rectangular shape or a rectangle-like shape defined in the first and second directions DR1 and DR2 in a plan view, but the disclosure is not limited thereto.

The second support member SP_2 may support the second area PNL_2 of the display panel PNL. The second support member SP_2 may be disposed on the bottom surface of the second area PNL_2 of the display panel PNL. The second support member SP_2 may include segments SG, which may extend in the second direction DR2 and be spaced apart from one another in the first direction DR1. For example, the second support member SP_2 may be a group of segments SG, which may be disposed on the bottom surface of the second area PNL_2 of the display panel PNL.

The third support member SP_3 may support the third area PNL_3 of the display panel PNL. The third support member SP_3 may be disposed on the bottom surface of the third area PNL_3 of the display panel PNL. The third support member SP_3 may include segments SG, which may extend in the second direction DR2 and be spaced apart from one another in the first direction DR1. For example, the third support member SP_3 may be a group of segments SG, which may be disposed on the bottom surface of the third area PNL_3 of the display panel PNL. The third support member SP_3 may have substantially a same structure as the second support member SP_2.

The segments SG may have a shape whose width in the first direction DR1 decreases in a direction toward a second side in the third direction DR3 in respect to FIG. 4, in a plan view, but the disclosure is not limited thereto.

The width, in the third direction DR3, of the first support member SP_1 (or the thickness of the first support member SP_1) may be less (or smaller) than the width, in the third direction DR3, of the second and third support members SP_2 and SP3 (or the thickness of the second and third support members SP_2 and SP_3). As the thickness of the first support member SP_1 is less (or smaller) than the thicknesses of the second and third support members SP_2 and SP_3, an air gap corresponding to the difference between the thickness of the first support member SP_1 and the thickness of the second and third support members SP_2 and SP_3 may be formed on a second side, in the third direction DR3, of the first support member SP_1. As the air gap is formed below the first support member SP_1, any impact applied to the display panel PNL may be alleviated. For example, in response to an object such as a pen or the like dropping onto the first area PNL_1 of the display panel PNL, the air gap may absorb the impact from the object.

As illustrated in FIGS. 1 and 2, the panel container SD may accommodate the display panel PNL and at least a part of the panel support SP and may assist with the sliding of the display device 1. The panel container SD may include a first container SD_1, which may be disposed in the middle of the display device 1, a second container SD_2, which may be disposed on a second side, in the first direction DR1, of the first container SD_1 to include the first bendable area RA_1, and a third container SD_3, which may be disposed on a first side, in the first direction DR1, of the first container SD_1 to include the second bendable area RA_2.

The first container SD_1 may connect the second and third containers SD_2 and SD_3 therebetween. For example, the first container SD_1 may include a (1_1)-th container SD_1a, which may connect a first side, in the second direction DR2, of the second container SD_2 and a first side, in the second direction DR2, of the second container SD_2, and a (1_2)-th container SD_1b, which may connect a second side, in the second direction DR2, of the second container SD_2 and a second side, in the second direction DR2, of the third container SD_3.

Rails may be formed on an inside of the second and third containers SD_2 and SD_3 and may thus guide the sliding of the display panel PNL, but the disclosure is not limited thereto.

A structure of the support film 100 of the display device 1 according to an embodiment will hereinafter be described.

Figure 5:
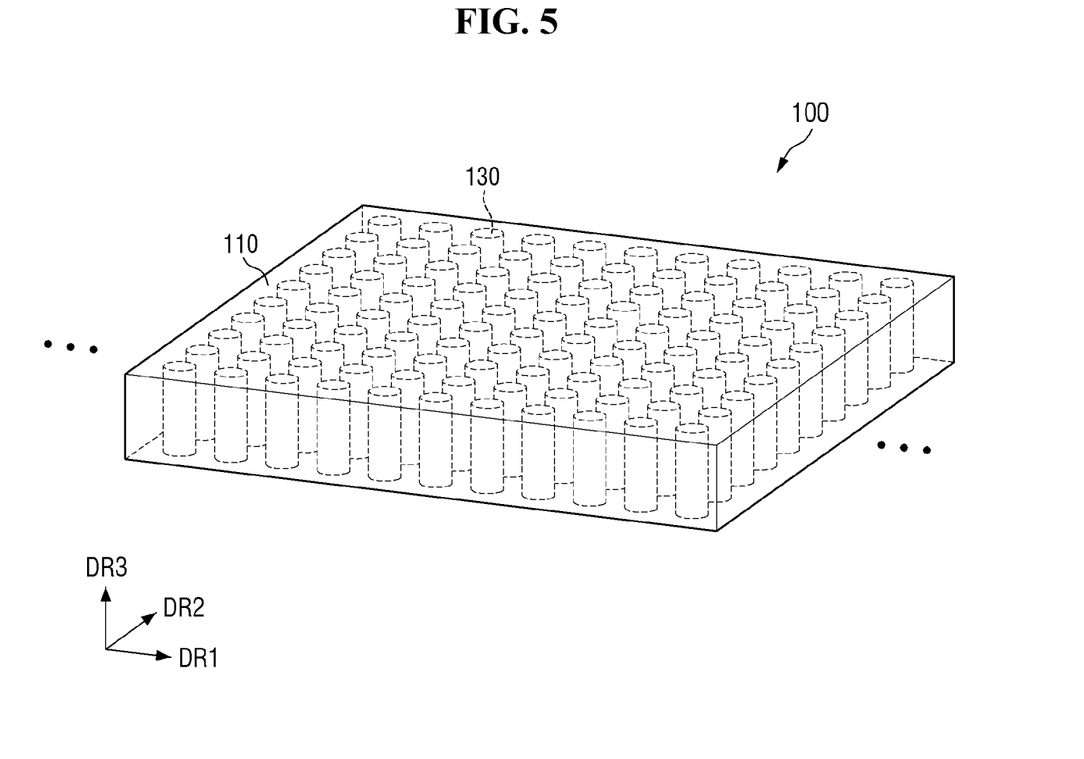
FIG. 5 is a schematic perspective view illustrating a support film of a display device according to an embodiment.
Figure 6:
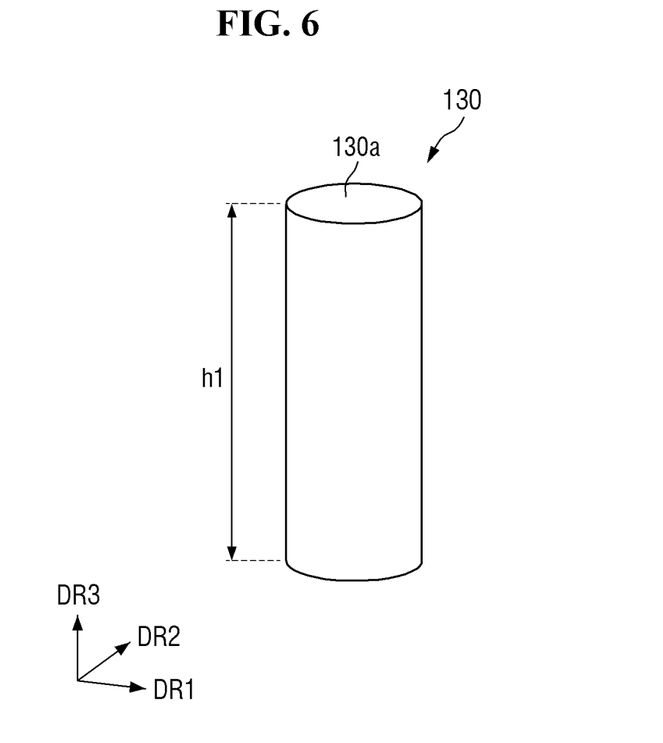
FIG. 6 is a schematic perspective view illustrating a buffer member disposed inside a support film of a display device according to an embodiment.
Figure 7:
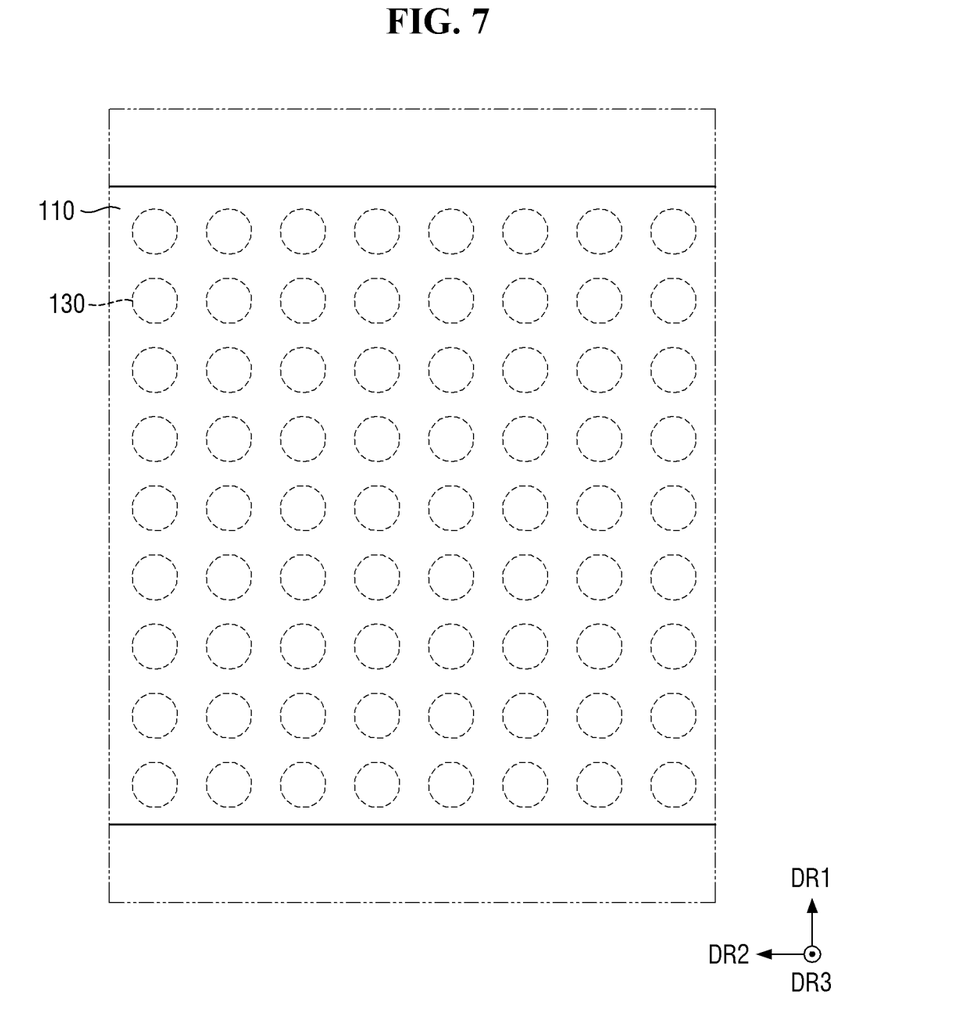
FIG. 7 is a schematic plan view of a support film of a display device according to an embodiment.
Figure 8:
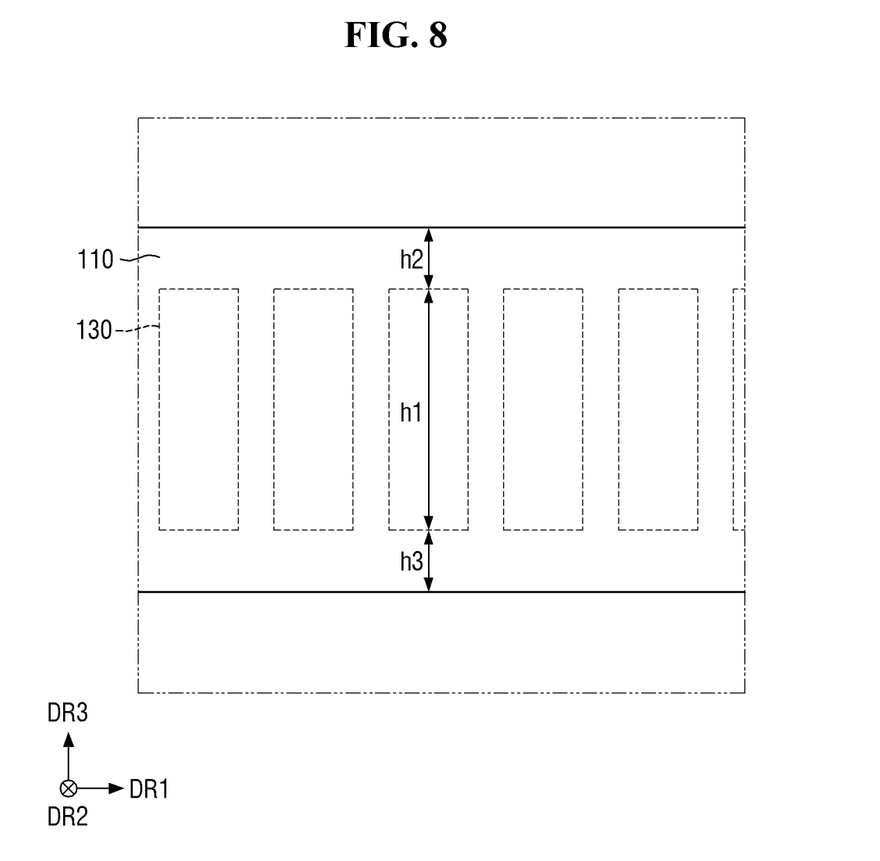
FIG. 8 is a schematic side view of a support film of a display device according to an embodiment.

FIG. 5 is a schematic perspective view illustrating a support film of a display device according to an embodiment. FIG. 6 is a schematic perspective view illustrating a buffer member disposed inside a support film of a display device according to an embodiment. FIG. 7 is a schematic plan view of a support film of a display device according to an embodiment. FIG. 8 is a schematic side view of a support film of a display device according to an embodiment.

Referring to FIGS. 5 to 8, the support film 100 of the display device 1 according to an embodiment may include a base portion 110 and a buffer member 130.

The base portion 110 may function as a base of the support film 100. For example, the base portion 110 may form an exterior of the support film 100. In some embodiments, the support film 100 may have a rectangular parallelepiped shape, but is not limited thereto.

The base portion 110 may include (or may be made of) resin. For example, the base portion 110 may include an epoxy-based resin, an acryl-based resin, a polyimide-based resin, or the like.

The buffer members 130 of the support film 100 may serve to improve an impact resistance of the support film 100. Since the buffer member 130 includes a material having rigidity, it is possible to prevent damage from being applied to the support film 100 by mitigating an external impact. The buffer member 130 may include a metal material such as SUS304 or the like.

The buffer members 130 may be dispersedly disposed in the base portion 110. The buffer members 130 may be arranged to be spaced apart from each other in the first direction DR1 and the second direction DR2 within the base portion 110. For example, the buffer members 130 may be arranged in M columns in the second direction DR2 and N rows in the first direction DR1 in the base portion 110. This may be formed by a manufacturing process of the support film, which will be described below.

The buffer member 130 may have a rod shape. Referring to FIG. 6, the buffer member 130 may have a shape extending in the third direction DR3, but is not limited thereto. For example, the buffer member 130 may have a spherical shape. FIGS. 5 to 8 illustrate that the buffer member 130 extends in the third direction DR3. The buffer member 130 may have a first thickness h1 in the third direction DR3 and a cross-section 130a parallel to a plane defined in the first direction DR1 and the second direction DR2.

In some embodiments, the buffer member 130 may have a cylindrical shape with sides, for example, the cross-section 130a being circular and extending in the third direction DR3, but is not limited thereto. For example, the buffer member 130 may have a rectangular cross-section and may have a rectangular parallelepiped shape extending in the third direction DR3. FIGS. 5 to 8 illustrate that the buffer member 130 may be a cylindrical shape extending in the third direction DR3.

Referring to FIG. 7 in conjunction with FIGS. 5 and 6, the buffer member 130 may have a cross-section 130a parallel to a plane defined in the first direction DR1 and the second direction DR2, thereby reducing an area where the impact resistance effect is reduced depending on the location of an external impact. For example, the external impact may be mostly applied in the third direction DR3, so that the cross-section 130a of the buffer member 130 may be parallel to a plane defined in the first direction DR1 and the second direction DR2. Accordingly, an area for absorbing the external shock perpendicular to the first direction DR1 and the second direction DR2 may be increased to effectively absorb the external shock. If the cross section of the buffer member 130 is not parallel to a plane defined in the first direction DR1 and the second direction DR2, an area absorbing the external shock applied in the third direction DR3 may be reduced.

Referring to FIG. 8 in conjunction with FIGS. 5 and 6, the buffer members 130 may be arranged to be spaced apart from each other in the first direction DR1. Accordingly, in case that the display device 1 according to an embodiment is extended in the first direction DR1, the sliding operation of the support film 100 may be facilitated even in case that a shear stress in the first direction DR1 acts on the support film 100 because of the sliding operation of the display panel PNL and the panel support SP in the first direction DR1.

The buffer members 130 may be disposed inside the base portion 110 to be covered by the base portion 110 in sides in the third direction DR3. For example, the buffer members 130 may be spaced apart in the third direction DR3 from a side surface of the base portion 110 in the third direction DR3 by a second width h2, and may be spaced apart in the third direction DR3 from another side surface of the base portion 110 in the third direction DR3 by a third width h3. The thickness of the base portion 110 may be defined as the sum of the first thickness h1, the second width h2, and the third width h3 of the buffer member 130.

As described above, in case that the display device 1 according to an embodiment is extended in the first direction DR1, a shear stress may be applied to the support film 100 in the first direction DR1 because of the slide operation of the display panel PNL and the panel support SP in the first direction DR1, and in this case, the thickness of the support film 100 may be reduced. In case that a shear stress in the first direction DR1 is applied to the support film 100 in a state in which a side of the buffer member 130 in the third direction DR3 contacts a side of the base portion 110 in the third direction DR3, there is a risk that the buffer member 130 protrudes from the base portion 110. Accordingly, by disposing the buffer member 130 to be spaced apart from sides of the base portion 110 in the third direction DR3, it is possible to prevent the buffer member 130 from protruding, which may occur in case that a shear stress acts in the first direction DR1 on the support film 100. In some embodiments, the first thickness h1 of the buffer member 130 may be about 88% or less of the thickness of the base portion 110, but is not limited thereto.

With the configuration as described above, the support film of the display device 1 according to an embodiment may have improved impact resistance to withstand external impact applied in the third direction DR3 while facilitating the sliding in the first direction DR1.

Hereinafter, a process for manufacturing a support film of the display device 1 according to an embodiment will be described.

FIGS. 9 to 12 are schematic views for explaining a process of manufacturing a support film of a display device according to an embodiment.

Figure 9:
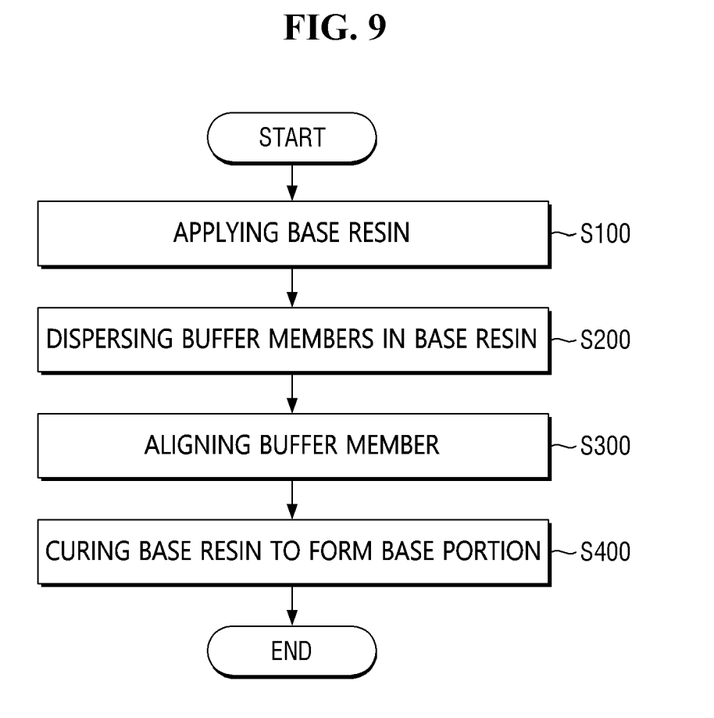
FIGS. 9 to 12 are schematic views for explaining a process of manufacturing a support film of a display device according to an embodiment.

Referring to FIG. 9, the process of manufacturing the support film 100 of the display device 1 according to an embodiment may include applying a base resin 110' (S100), dispersing the buffer member 130 in the applied base resin 110' (S200), aligning the dispersed buffer member 130 (S300), and curing the base resin 110' to form the base portion 110 (S400).

Figure 10:
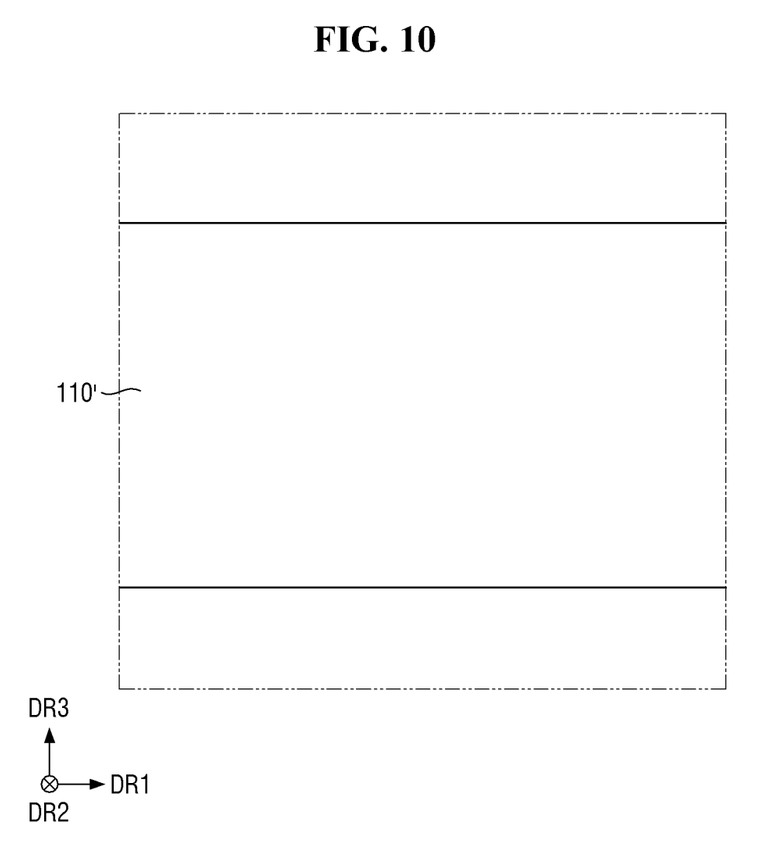

Referring to FIG. 10, the base resin 110' may be applied. The base resin 110' may be in a liquid form and may include various curing agents such as a UV curing agent, a thermal curing agent, or the like. For example, the base resin 110' may be in a state before the base portion 110 is cured. In some embodiments, the base resin 110' may include an epoxy-based resin, an acryl-based resin, a polyimide-based resin, or the like.

Figure 11:
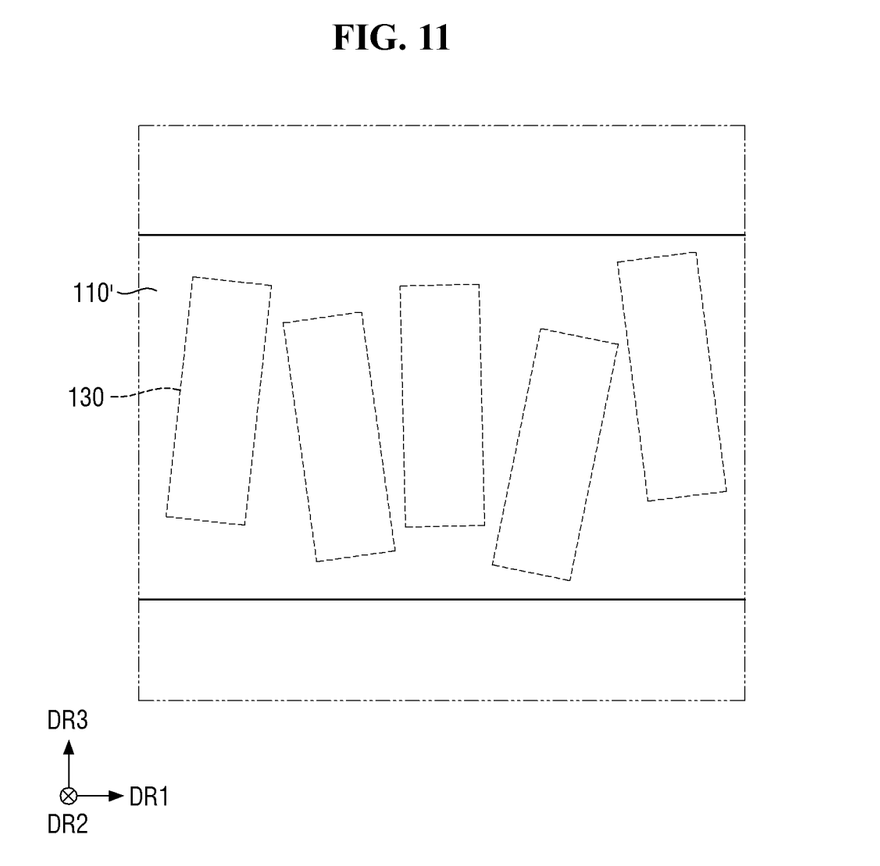

Referring to FIG. 11, the buffer member 130 may be dispersed in the liquid base resin 110'. The buffer members 130 may be randomly dispersed without directionality in the liquid base resin 110'.

Figure 12:
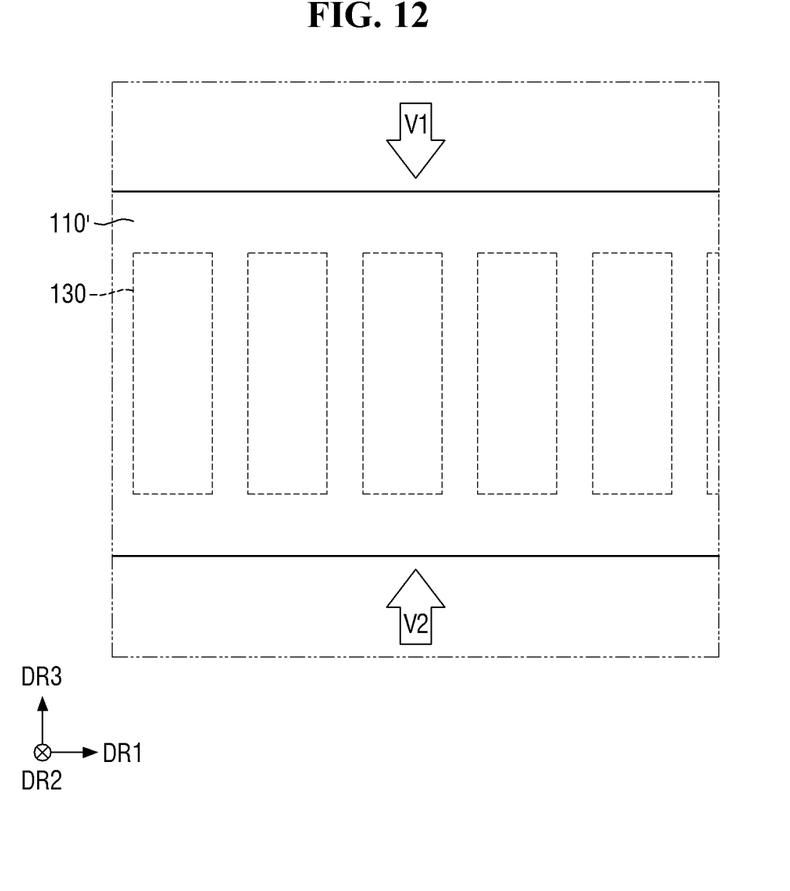

Referring to FIG. 12, voltages having different potential values may be applied to the base resin 110' to align the buffer members 130. For example, by applying a first voltage V1 to a side of the base resin 110' in the third direction DR3 and a second voltage V2 to another side in the third direction DR3 to form an electric field, the buffer members 130 including a metal may be aligned as shown in FIG. 5. In some embodiments, the potential value of the first voltage V1 may be greater than the potential value of the second voltage V2, but is not limited thereto.

The base portion 110 may be formed by curing the base resin 110' containing the aligned buffer members 130, the base resin 110' may be cured in a state in which an electric field is formed by applying the first voltage V1 and the second voltage V2. For example, since the buffer members 130 may be aligned within the electric field formed by the first voltage V1 and the second voltage V2, the base resin 110' may be cured in a state in which the first voltage V1 and the second voltage V2 are applied. By curing the base resin 110' to form the base portion 110, a support film as shown in FIG. 5 may be manufactured.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display panel that slides in a first direction;
a panel support that supports a bottom surface of the display panel, the panel support including a first support member, a second support member, and a third support member with the second support member between the first support member and the third support member; and
a support film disposed between the display panel and the panel support, wherein
the support film comprises a base portion and buffer members each in a rod shape dispersed in the base portion, and
a thickness of the first support member is less than thicknesses of the second and third support members to form an air gap below the first support member.

2. The display device of claim 1, wherein
the display panel comprises:
a first area, and
a second area disposed in a side of the first area in the first direction and sliding in the first direction,
the panel support comprises:
a support plate supporting the bottom surface of the first area of the display panel, and
segments supporting the bottom surface of the second area of the display panel, and
the support film overlaps the first area of the display panel and the second area of the display panel in a plan view.

3. The display device of claim 2, wherein
each of the segments extends in a second direction intersecting the first direction and is spaced apart from each other in the first direction, and
each of the buffer members extends in a third direction perpendicular to the first direction and the second direction.

4. The display device of claim 3, wherein a width of each of the buffer members in the third direction is smaller than a width of the support film in the third direction.

5. The display device of claim 3, wherein the buffer members are disposed to be spaced apart from sides of the support film in the third direction.

6. The display device of claim 5, wherein the buffer members are arranged to be spaced apart from each other in the first direction.

7. The display device of claim 6, wherein the buffer members are arranged to be spaced apart from each other in the second direction.

8. The display device of claim 3, wherein
each of the buffer members includes a metal material, and
the base portion includes resin.

9. The display device of claim 2, wherein the display panel further includes:
a third area disposed on another side of the first area in the first direction and sliding in the first direction, and
a subsidiary area disposed on a side of the first area in a second direction intersecting the first direction.

10. A display device comprising:
a display panel including:
a flat area, and
a bendable area disposed adjacent to the flat area;
a panel support that supports a bottom surface of the display panel, the panel support including a first support member, a second support member and a third support member with the second support member between the first support member and the third support member; and
a support film disposed between the display panel and the panel support, wherein
the support film includes a base portion and buffer members dispersed in the base portion,
the buffer members extend in a thickness direction, and a thickness of the first support member is less than thicknesses of the second and third support members to form an air gap below the first support member.

11. The display device of claim 10, wherein the panel support comprises:
   a support plate overlapping the flat area in a plan view, and
   segments overlapping the bendable area in a plan view, and
   the bendable area slides in a first direction parallel to the flat area.

12. The display device of claim 11, wherein
   each of the segments extends in a second direction parallel to the flat area and intersecting the first direction, and
   the segments are spaced apart from each other in the first direction.

13. The display device of claim 12, wherein a thickness of a buffer member of the buffer members is smaller than a thickness of the support film.

14. The display device of claim 13, wherein the buffer members are arranged to be spaced apart from each other in the first direction.

15. The display device of claim 12, wherein
   each of the buffer members includes a metal material, and
   the base portion includes resin.

16. A method of manufacturing a support film, the support film supporting a bottom surface of a display panel that slides in a first direction, the method comprising:
   applying a base resin;
   dispersing buffer members in the base resin;
   forming electric field in the base resin to align the buffer members; and
   curing the base resin on which the buffer members are aligned.

17. The method of claim 16, wherein each of the buffer members includes a metal material.

18. The method of claim 17, wherein in a step of aligning the buffer members, the buffer members are aligned to be spaced apart from each other in the first direction.

19. The method of claim 18, wherein in the step of aligning the buffer members, each of the buffer members extends in a thickness direction of the base resin.

* * * * *